United States Patent [19]
Cyrot-Lackmann et al.

[11] Patent Number: 6,103,023
[45] Date of Patent: Aug. 15, 2000

[54] THIN FILMS OF QUASICRYSTALLINE ALLOYS, THEIR PREPARATION AND THEIR USES

[75] Inventors: Françoise Cyrot-Lackmann, Biviers; Thierry Grenet, Le Sappey; Claire Berger, Grenoble; Guy Fourcaudot, Saint-Ismier; Claire Gignoux, Grenoble, all of France

[73] Assignee: Centre National de la Recherche Scientifique, Paris, France

[21] Appl. No.: 08/930,795

[22] PCT Filed: Apr. 2, 1996

[86] PCT No.: PCT/FR96/00494

§ 371 Date: Oct. 6, 1997

§ 102(e) Date: Oct. 6, 1997

[87] PCT Pub. No.: WO96/31640

PCT Pub. Date: Oct. 10, 1996

[30]     Foreign Application Priority Data

Apr. 4, 1995 [FR] France .................................. 95 03938

[51] Int. Cl.⁷ .................................................. C22C 21/00
[52] U.S. Cl. ........................ 148/403; 148/437; 148/518; 148/688; 106/286.2; 106/286.5; 204/192.15
[58] Field of Search ..................... 148/403, 437, 148/518, 688; 420/528, 538; 204/192.15; 106/286.2, 286.5

[56]            References Cited

U.S. PATENT DOCUMENTS

| | | | |
|---|---|---|---|
| 4,772,370 | 9/1988 | Kreider | 204/192.15 |
| 5,397,490 | 3/1995 | Masumoto et al. | 420/528 |
| 5,432,011 | 7/1995 | DuBois et al. | 420/538 |
| 5,472,920 | 12/1995 | DuBois et al. | 420/528 |
| 5,571,344 | 11/1996 | DuBois et al. | 148/437 |
| 5,900,210 | 5/1999 | Buchler et al. | 420/528 |

FOREIGN PATENT DOCUMENTS 2 685 349   12/1991   France .

93/13237   7/1993   WIPO .

OTHER PUBLICATIONS

*Physical Review B*, vol. 45, No. 22, Jun. 1992, C. Chien et al., "Three States of $Al_{65}Cu_{20}Fe_{15}$: Amorphous, Crystalline, and Aquasicrystalline".

*Jpn. J. Appl. Phys.*. vol. 33, 1994, pp. L736–L738; N. Ichikawa, et al. "Preparation of Al–Pd–Mn Quasicrystal Films by Laser Ablation Method".

*Journal of Materials Science Letters*, vol. 7, 1988, pp. 1284–1286, L. He, et al., "Decagonal Quasicrystals with Different Periodicites along the Tenfold Axis in Rapidly Solidified $Al_{65}Cu_{20}M_{15}$ (M=Mn, Fe, Co or Ni)".

*Thin Solid Films*, vol. 163, 1988, pp. 61–66, K. Mihama, "Growth of Al–Mn Quasicrystals by Vacuum Deposition".

*Thin Solid Films*, vol. 220, 1992, pp. 172–175, J. Reyes–Gasga et al., "Nucleation of the Decagonal Quasi–Crystalline Phase in Al–Cu–Co–Si Thin Films".

*Primary Examiner*—George Wyszomierski
*Attorney, Agent, or Firm*—Burns, Doane, Swecker & Mathis, LLP

[57]            ABSTRACT

Thin film of quasicrystalline alloy having a thickness of between approximately 0.01 and 10 μm comprising one or more quasicrystalline phases having a volume which represents at least 60% by volume of the quasicrystalline alloy, a quasicrystalline phase being either a quasicrystalline phase which exhibits rotational symmetries normally incompatible with a translational symmetry, i.e., symmetries with a 5-, 8-, 10- and 12-fold rotation axis, or an approximant phase or an approximant compound which is a true crystal, the approximant phase or compound having a crystallographic structure which remains compatible with the translational symmetry, but which has, in an electron diffraction photograph, diffraction patterns whose symmetry is close to that of 5-, 8-, 10- or 12-fold rotation axes; wherein the alloy has the following nominal composition, which is given in atomic percentages: $Al_a Re_r Si_s X_d Mn_m$ in which X represents at least one element chosen from B, C, P, S and Ge; $15 \leq r+m \leq 20$, $0 \leq d \leq 5$, $8 \leq s \leq 15$, a+r+s+d+m=100.

18 Claims, 9 Drawing Sheets

THIN FILMS OF QUASICRYSTALLINE ALLOYS, THEIR PREPARATION AND THEIR USES

BACKGROUND OF THE INVENTION

1. Field of the Invention

The present invention relates to thin films of quasicrystalline alloys, their preparation and their uses.

2. Description of Related Art

Quasicrystalline alloys, which are alloys consisting of one or more quasicrystalline phases, are known. Quasicrystalline phase is understood to mean a quasicrystalline phase in the strict sense, or an approximant phase. A quasicrystalline phase in the strict sense is a phase exhibiting a rotational symmetry normally incompatible with the translational symmetry, i.e. a symmetry with a 5-, 8-, 10- or 12-fold rotation axis, these symmetries being revealed by the diffraction of radiation. By way of example, mention may be made of the icosahedral phase of point group $m\bar{3}\bar{5}$ and the decagonal phase of point group 10/mmm. An approximant phase or approximant compound is a true crystal insofar as its crystallographic structure remains compatible with the translational symmetry, but it has, in the electron diffraction photograph, diffraction patterns whose symmetry is close to that of 5-, 8-, 10-, or 12-fold rotation axes. By way of example, mention may be made of the orthorhombic phase $O_1$, characteristic of an alloy having the atomic composition $Al_{65}Cu_{20}Fe_{10}Cr_5$, the unit cell parameters of which are: $a_o^{(1)}=2.366$, $b_o^{(1)}=1.267$ and $c_o^{(1)}=3.252$ in nanometer. This orthorhombic phase $O_1$ is called the approximant: of the decagonal phase. Moreover, this is so closely so that it is not possible to distinguish its X-ray diffraction pattern from that of the decagonal phase. It is also possible to mention the rhombohedral phase having parameters $a_R=3.208$ nm, $\alpha=36°$ $Al_{64}Cu_{24}Fe_{12}$ in terms of number of atoms. This phase is an approximant, phase of the icosahedral phase. It is also possible to mention orthorhombic phases $O_2$ and $O_3$ having respective parameters $a_o^{(2)}=3.83$; $b_o^{(2)}=0.41$; $c_o^{(2)}=5.26$ and $a_o^{(3)}=3.25$; $b_o^{(3)}=0.41$; $c_o^{(3)}=9.8$ in nanometer, which are present in an alloy of composition $Al_{63}Cu_{17.5}Co_{17.5}Si_2$ in terms of number of atoms or else the orthorhombic phase $O_4$ having parameters $a_o^{(4)}=1.46$; $b_o^{(4)}=1.23$; $c_o^{(4)}=1.24$ in nanometer, which is formed in the alloy of composition $Al_{63}Cu_8Fe_{12}Cr_{12}$ in terms of number of atoms. It is also possible to mention a C phase of cubic structure, very often observed to coexist with the true quasicrystalline or approximant phases. This phase, which is formed in certain Al-Cu-Fe and Al-Cu-Fe-Cr alloys, consists of a superstructure, due to the effect of chemical order of the alloy elements with respect to the aluminum sites, of a phase of structure of the Cs-Cl type and having a lattice parameter $a_1=0.297$ nm. Mention may also be made of an H phase of hexagonal structure which derives directly Erom the C phase as demonstrated by the epitaxial relationships, observed using electron microscopy, between crystals of the C and H phases and the simple relationships which connect the crystalline lattice parameters, namely $a_H=3\sqrt{2}a_1/\sqrt{3}$ (to within 4.5%) and $c_H=3\sqrt{3}a_1/2$ (to within 2.5 %). This phase is isotypic of a hexagonal phase, denoted by ΦAlMn, discovered in Al-Mn alloys containing 40% by weight of Mn. The cubic phase, its superstructures and the phases which derive therefrom constitute a class of approximant phases of the quasicrystalline phases of neighboring compositions. For more information about quasicrystalline phases in the strict sense, and their approximants, reference may be made to WO 93/13237 (J. M. Dubois, et al.).

Certain quasicrystalline alloys have been prepared in the form of thin films. Thin films of quasicrystalline alloys $Al_{62.5}Cu_{25}Fe_{12.5}$, prepared by sputtering followed by a heat treatment, which have a thickness of 0.2 to 0.3 μm and a high electrical resistivity, have been described by T. Klein et al., Appl. Phys. Letters, 64, 431, 1994. Thin films of a quasicrystalline alloy $Al_{65}Cu_{20}Fe_{15}$ having a thickness of about 10 μm obtained by vacuum evaporation have been described by C. L. Chien et al., Phys. Rev. B 45 12793 (1992). Thin films of alloy $Al_{62}Cu_{20}Co_{15}Si_3$ having a thickness of 100–500 Å obtained by vacuum evaporation have been described by J. Reyes-Gasga, Thin Solid Films, 220 (1992) 172–176. Films of quasicrystalline alloy having a thickness of 0.5 μm, prepared by a laser ablation technique using a target having the composition $Al_{70}Pd_{22}Mn_8$ or $Al71Pd_{20}Mn_9$ or $Al_{70}Pd_{10}Mn_{20}$ have been described by N. Ichigawa, et al., Jpn. Appl. Phys. Vol. 33, L736–738 (1994).

SUMMARY OF THE INVENTION

The subject of the present invention is novel thin films of quasicrystalline alloy, their preparation and their uses.

A thin film of quasicrystalline alloy according to the present invention is characterized in that:

it has a thickness of between approximately 0.01 and 10 μm;

the quasicrystalline alloy consists of one or more quasicrystalline phases, the volume of which represents at least 60% by volume of the quasicrystalline alloy, a quasicrystalline phase being either a quasicrystalline phase in the strict sense, which exhibits rotational symmetries normally incompatible with the translational symmetry, i.e. symmetries with a 5-, 8-, 10- and 12-fold rotation axis, or an approximant phase or an approximant compound which is a true crystal, the crystallographic structure of which remains compatible with the translational symmetry, but which has, in the electron diffraction photograph, diffraction patterns whose symmetry is close to that cf 5-, 8-, 10- or 12-fold rotation axes;

the alloy has one of the following nominal compositions, which are given in atomic percentages:

$Al_aPd_pRe_rX_dY_eT_f$ (I) in which X represents at least one element chosen from B, C, P, S, Ge and Si, Y represents at least one element chosen from V, Mo, Ti, Zr, Nb, Cr, Fe, Co, Mn, Ru, Rh, Ni, W, Hf, Os, Ir, Pt, Ta, T represents a rare earth, $13 \leq P \leq 27$, $4 \leq c \leq 16$, $0 \leq r \leq 28$, $0 \leq d \leq 5$, $0 \leq f \leq 4$, $17 \leq b+c+e \leq 45$, and $P+r+c+d+e+F=100$;

$Al_aCu_bFe_cX_dY_e$ (II) in which X represents at least one element chosen from B, C, P, S, Ge and Si, Y represents at least one element chosen from V, Mo, Ti, Zr, Nb, Cr, Mn, Co, Ru, Rh, Pd, Ni, La, Hf, Re, Y, W, Os, Ir, Pt, Ta and the rare earths, $14 \leq b \leq 30$, $0 \leq c \leq 20$, $0 \leq e \leq 20$, $0 \leq d \leq 5$, $21 \leq b+c+e \leq 45$, and $a+b+c+d+e=100$;

$Al_aCu_bCo_cX_dY_eT_f$ (III) in which X represents at least one element chosen from B, C, P, S, Ge and Si; Y represents at least one element chosen from V, Mo, Ti, Zr, Nb, Cr, Mn, Fe, Ru, Rh, Pd, Ni, La, Hf, Re, Y, W, Os, Ir, Pt, Ta; T represents at least one rare earth; with $14 \leq b \leq 27$; $8 \leq c' \leq 24$; $28 \leq b+c'+e \leq 45$; $0 \leq d \leq 5$; $0 \leq e \leq 10$; $0 \leq f \leq 4$; $a+b+c'+d+e+f=100$;

$Al_aX_dY_eZ_{e'}$ (IV) in which X represents at least one element chosen from B, C, P, S, Ge and Si, Y represents at least one element chosen from V, Mo, Cr, Mn, Fe, Co, Ru, Rh, Pd, Ni, Z represents at least one element chosen from Ti, Zr, Nb, La, Hf, Re, Y, W, Os, Ir, Pt, Ta and the rare earths; $0 \leq d \leq 5$, $18 \leq e \leq 29$, $0 \leq e' \leq 18$, $18 \leq e+e' \leq 30$ and $a+d+e+e'=100$;

$Al_aCu_bCo_{b'}(B,C)_cM_dN_e$ (V) in which M represents at least one element chosen from Fe, Cr, Mn, Ni, Ru, Os, V, Mg, Zn and Pd, N represents at least one element chosen from W, Ti, Zr, Hf, Rh, Nb, Ta, Y, Si, Ge and the rare earths and $a \geq 50$, $0 \leq b \leq 14$, $0 \leq b' \leq 22$, $0 \leq b+b' \leq 30$, $0 \leq c \leq 5$, $8 \leq d \leq 30$, $c+d \geq 10$, $a+b+b'+c+d+e=100$;

$Al_aRe_rSi_sX_dY_eMn_m$ (VI) in which X represents at least one element chosen from B, C, P, S and Ge, Y represents at least one element chosen from V, Mo, Ti, Zr, Nb, Cr, Fe, Co, Ru, Rh, Pd, Ni, La, Hf, Y, W, Os, Ir, Pt, Ta and the rare earths; $15 \leq r+m \leq 20$, $0 \leq d \leq 5$, $0 \leq e \leq 0$, $8 \leq s \leq 15$, $a+r+s+d+e+m=100$.

DETAILED DESCRIPTION OF THE PREFERRED EMBODIMENTS

Figure 1:
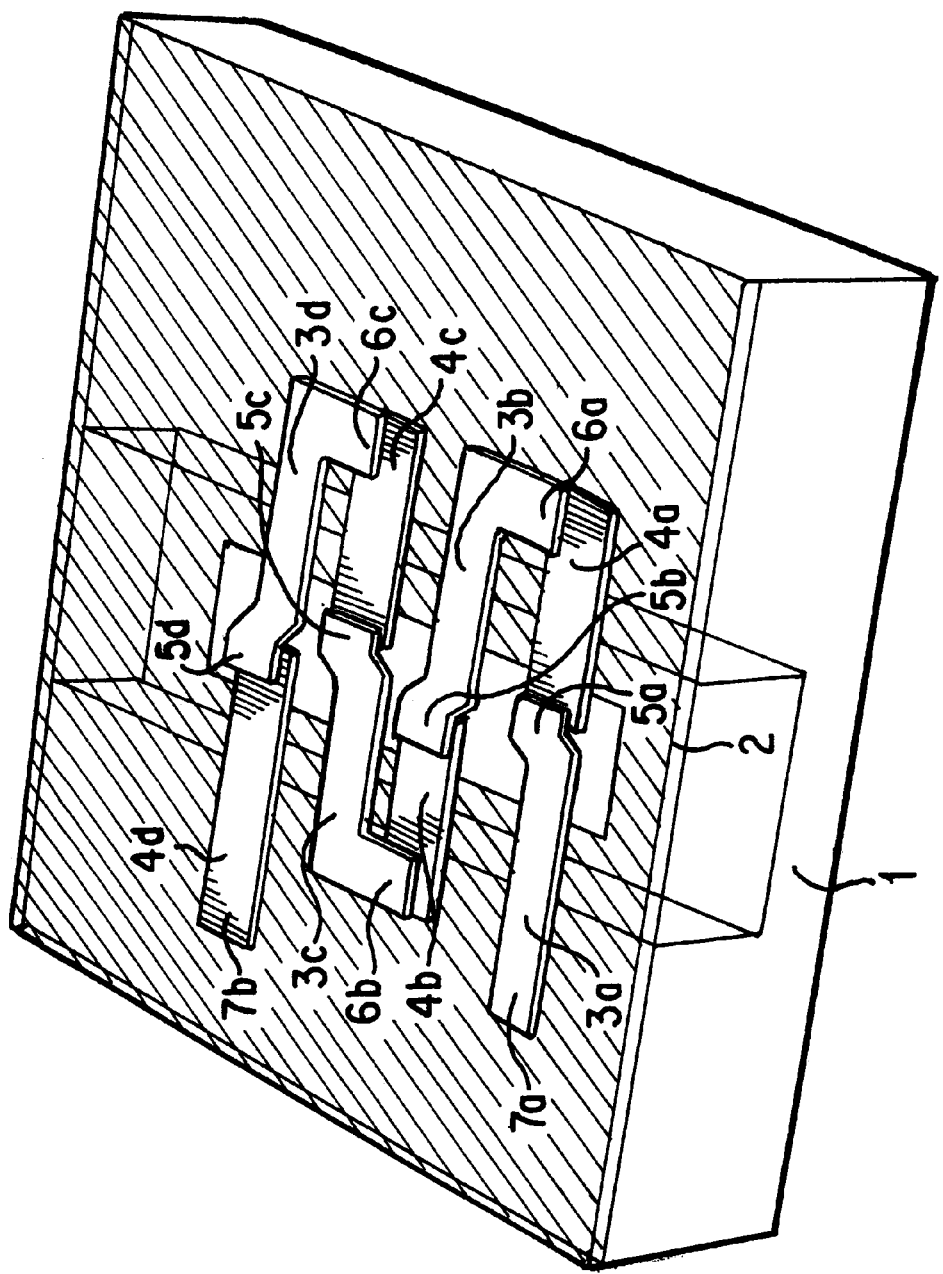
FIG. 1 is a diagram of a thermopile according to the present invention.

Among the thin films of quasicrystalline alloy according to the present invention, mention may be made of the films of ternary alloys AlPdRe of the group (I) which have an icosahedral structure. Among these compositions, those which have the limiting Al contents are $Al_{79}Pd_{17}Re_4$ and $Al63Pd_{26}Re_{11}$, those which have the limiting Pd contents are $Al_{61}Pd_{27}Re_{12}$ and $Al_{79}Pd_{13}Re_8$ and those which have the limiting Re contents are $Al_{79}Pd_{17}Re_4$ and $Al_{67}Pd_{17}Re_{16}$. An intermediate composition is $Al_{70}Pd21Re_{8.5}$. The $Al_{73}Re_{17}Si_{10}$ films (group VI) have an approximant structure of cubic type. The $Al_{73}Pd_{18.5}Mo_{8.5}$ films and the $Al_{73}Pd_{21}Re_{6.5}Mo_2$ films have a structure of the icosahedral type.

The thin films of the present invention are obtained by vapor deposition on a substrate. The vapor deposition is optionally followed by a heat treatment.

The substrate may be chosen from electrically insulating materials such as, for example, aluminum oxide, strontium titanate, silica, magnesium oxide, mica, sodium chloride, silicon and quartz. It may also be chosen from electrically conductive materials, such as, for example, metals and their alloys, in particular aluminum-based alloys, copper-based alloys and iron-based alloys, in particular stainless steels. The choice of i:he substrate depends on the envisaged application.

Various vapor deposition processes are known. By way of example, mention may be made of sputtering, the technique of vacuum evaporation, and laser ablation.

For each of the vapor deposition techniques, it is possible to use either a single source consisting of a material whose composition will be adjusted so as to obtain the desired composition on the substrate. It is also possible to use several sources, each corresponding to one of the elements making up the quasicrystalline alloy. When several sources are used, it is possible to carry out the deposition simultaneously or sequentially. Simultaneous deposition using several sources requires the simultaneous control of several deposition streams in order to obtain the desired alloy composition. When successive films are deposited using several sources, it is sometimes necessary to carry out a subsequent heat treatment in order to mix the various components deposited and obtain the quasicrystalline alloy.

The heat treatment used for treating the coating obtained comprises a slow temperature rise, at less than 20° C./min, preferably approximately 1° C., up to a temperature corresponding to the region for forming the quasicrystalline structure, and a temperature hold, at this temperature, for a period of from approximately 2 to approximately 4 hours.

The thin films of quasicrystalline alloy of the present invention are useful as they are. They are obtained on a substrate in a form which can be directly used, without subsequent polishing. They allow to coat nonplanar surfaces, including surfaces having cavities. Furthermore, the small quantities of materials deposited make them particularly useful when the deposited elements are expensive elements. In addition, the preparation processes are not contaminating.

The thin films of quasicrystalline alloy of the present invention exhibit, of course, all the properties inherent in quasicrystalline alloys, and in particular high thermal stability, excellent mechanical properties, such as high hardness and scratch resistance, high corrosion resistance and a low thermal conductivity.

The quasicrystalline alloys of the present invention have a high electrical resistivity, which is comparable to that of doped semiconductors and varies strongly with temperature and the composition of the quasicrystalline alloy. Contrary to the phenomena observed in the case of metals, the electrical resistivity of the quasicrystalline alloys increases when the temperature decreases and when the structural quality increases.

The present inventors have discovered that the particular atomic structure of the thin-film quasicrystalline alloys of the present invention enables them to be used for detecting infrared radiation. This particular atomic structure of the true quasicrystalline phases or of the approximants is manifested by 20 to 40 Å patterns which are repeated in a uniform manner and in which the electrons are confined. Depending on the quasicrystalline alloy composition, the three-dimensional confinement system obtained exhibits a pseudo-gap close to the Fermi level, the width of which is between 30 meV (corresponding to a radiation length of 40

μm) and 1 eV (1.24 μm) which depends on the composition of the quasicrystalline alloy and on the heat treatment which it has undergone. This property of the quasicrystalline alloys enables them to be used for various applications based, in particular, on the absorption of infrared radiation.

The thin films of quasicrystalline alloy also have excellent thermoelectric properties. Most of the quasicrystalline alloys have a high thermoelectric power S which varies as a function of the temperature and the composition of the quasicrystalline alloy; it is greater by a factor of 10 than that of normal metals and is comparable to that of semiconductors. The quasicrystalline alloys also have a low thermal conductivity K, which is conducive to establishing a thermal gradient, as well as an electrical conductivity a which is high enough not to excessively limit the Joule effect. The various materials may be compared among themselves by their $(S^2 \times \sigma)/K$ ratio. This ratio is close to $10^{-3}$ K$^{-1}$ for the quasicrystalline alloys in thin-film form (except for the quasicrystalline alloys of group (I) because their low-temperature electrical conductivity is too low), this being comparable with the values obtained for the materials used in the prior art. One of the advantages of using the quasicrystalline alloys in thin-film form is a substantial reduction in the response time of the devices in which these thin films are used as the active element.

Given their electrical properties, the thin-film quasicrystalline alloys of the present invention may also be used as a resistive layer for a temperature probe. The compositions of alloy $Al_aPd_pRe_rX_dY_eT_f$ of the above group (I) are particularly suitable for this application. Consequently, the subject of the present invention is also a resistive temperature probe in which the resistive layer is a thin film of quasicrystalline alloy $Al_aPd_pRe_rX_dY_eT_f$ (I) as defined above.

The resistive layer of a temperature probe must exhibit a strong monotonic variation of a parameter with temperature. It must be almost insensitive to the other variable parameters in cryostats (such as the pressure or the magnetic field). It must not disturb the cryogenic device (i.e. dissipate little power). It must be stable over time and give results which are reproducible from one measurement to another.

For the $Al_aPd_pRe_rX_dY_eT_f$ alloys of the above group (I), the $\rho_{4K}/\rho_{300K}$ variation may range up to 200, which is of the same order of magnitude as for carbon probes of the Speer® type. The magnetoconductance $$\frac{\rho(H)_T - \rho(H=0)_T}{\rho(H=0)_T}$$

is 3% at 10 K and 1.5% at 4 K, which causes an error in the temperature measurement of 4.6% at 10 K and 3.7% at 4 K. These values are comparable to those of carbon resistive probes. With regard to the power dissipated in the cryostat, taking into account the geometrical factors, the low-temperature resistances are of the order of about 10 ohms for ribbons of quasicrystalline alloy and of the order of KΩ for the thin films according to the present invention. From this standpoint too, the temperature probes having a thin film of quasicrystalline alloy are equivalent to carbon probes. Since the quasicrystalline alloys are stable over time, the temperature probes of the present invention have an advantage compared to carbon probes, which change from one cycling operation to another, and to the capacitive probes of the prior art, which drift over time.

Given their properties, the thin films of quasicrystalline alloys according to the present invention can be used as an infrared-radiation coupling element in a device which absorbs infrared radiation, in particular in infrared radiation detectors of the bolometer type. They can also be used in devices in which the thermoelectric properties, combined or not with the optical properties, play an important role, in particular thermopiles, thermocouples, electric generators and air-conditioning devices whose operation relies on he Peltier effect.

There is considerable interest in infrared detectors working in the near and far IR, i.e. in the range 1 μm–40 μm, corresponding to energies of from 1 eV to 0.03 eV.

The detectors conventionally used are based on semiconductors. These are semiconductors having a narrow band gap of between 5 and 11 μm, the reference system being the detector based on the mercury salt $Hg_xCd_{1-x}Te$. However, such detectors are not satisfactory since they have sensitivity and dispersion problems in the spectral range due to variations in concentration and in doping, these being difficult to control, and problems of stability over time. In addition, the alloys are difficult to obtain and consequently expensive. Radiation detectors active in this range are of great interest since many molecules absorb radiation in this range. Thus, such detectors have applications in the detection of pollution, moisture, the distribution of molecules in the atmosphere, in industrial thermography, night vision, in medical thermography, accurate cartography of temperatures in meteorology, geology, agriculture, etc. A judicious choice of the composition of the quasicrystalline alloy may allow modulation of the pseudo-gap and therefore allow preparation of a device which is active over a certain predetermined wavelength range. Furthermore, three-dimensional confinement prevents any orientation detection problem with regard to the incident flux. For specific applications, it will also be possible to use quasicrystalline thin films of decagonal structure having a high structural anisotropy in the optical properties. This is why the subject of the present invention is also the use of a thin film of quasicrystalline alloy according to the present invention as an infrared coupling element of an infrared detection device, as well as an infrared detection device having a thin film of quasicrystalline alloy as the infrared coupling element. By way of example, mention may be made of bolometers.

The thin films of quasicrystalline alloys of the present invention can also be used as the active element of a thermopile because of, on the one hand, their optical properties and, on the other hand, their thermoelectric properties. Only one of the ends of the active element is exposed to the infrared radiation and therefore heated. The temperature gradient which thus appears between the two ends of the thin-film element generates an electrical voltage due to the Seebeck effect which is measured in order to detect the infrared radiation. In order to increase the signal, it is possible to mount several thin-film elements in series, by alternating elements which have a positive thermoelectric power and elements which have a negative thermoelectric power. Consequently, another subject of the present invention is a thermopile having at least one active element consisting of a thin film of quasicrystalline alloy according to the present invention, preferably having, in alternation, active elements with a positive thermoelectric power and active elements with a negative thermoelectric power. The sign of the thermoelectric power is obtained by a suitable choice of the composition of the alloy. A diagram of a thermopile according to the present invention is given in FIG. 1. Placed on a substrate 1 is a membrane 2 which supports the thin-film elements having a positive thermoelectric power ($3_a$, $3_b$, $3_c$, $3_d$) and the thin-film elements having a negative thermoelectric power ($4_a$, $4_b$, $4_c$, $4_d$) which are alternated and connected via their ends, producing 7 junctions. The various thin-film elements have a configuration such that every other junction ($5_a$, $5_b$, $5_c$, $5_d$) is exposed to the radiation, the unexposed junctions ($6_a$, $6_b$, $6_c$) resting on the substrate. The thermal mass of the substrate keeps the temperature of the junctions resting on it constant, while the junctions exposed to the radiation heat up. The electrical voltage produced between the two free ends ($7_a$, $7_b$) during the heat-up is measured.

The thin films of quasicrystalline alloy of the present invention can also be used as the active element of an electricity generator. This is because, when a thin film of quasicrystalline alloy is subjected to a temperature gradient because of the fact that only one of its ends is exposed to a heat source, an electrical voltage is developed across its terminals by the Seebeck effect. When the terminals are connected to an external circuit, an electric current flows through the latter. Several thin-film elements may be mounted in series in order to increase the power of the device. The advantage of such a device is that it operates as long as the heat source maintaining the temperature gradient is present. This may be a radioactive source or solar energy. For this particular application, the good thermal stability of the quasicrystalline alloys is particularly important.

The quasicrystalline alloys of the present invention can also be used in a thermocouple. A thermo-couple according to the invention consists of two electrically insulating elements covered with a thin film of quasicrystalline alloy, the two elements being connected together at one of their ends, either by direct contact or by a metal. When the junction between the two elements is in the region where it is desired to measure the temperature, a voltage is developed by the Seebeck effect between the free ends of the elements, these elements being at ambient temperature. Measuring this voltage enables the temperature at the junction o be determined. The use of quasicrystalline alloys in a thermocouple is particularly advantageous because of their high resistance to corrosion.

Figure 2:
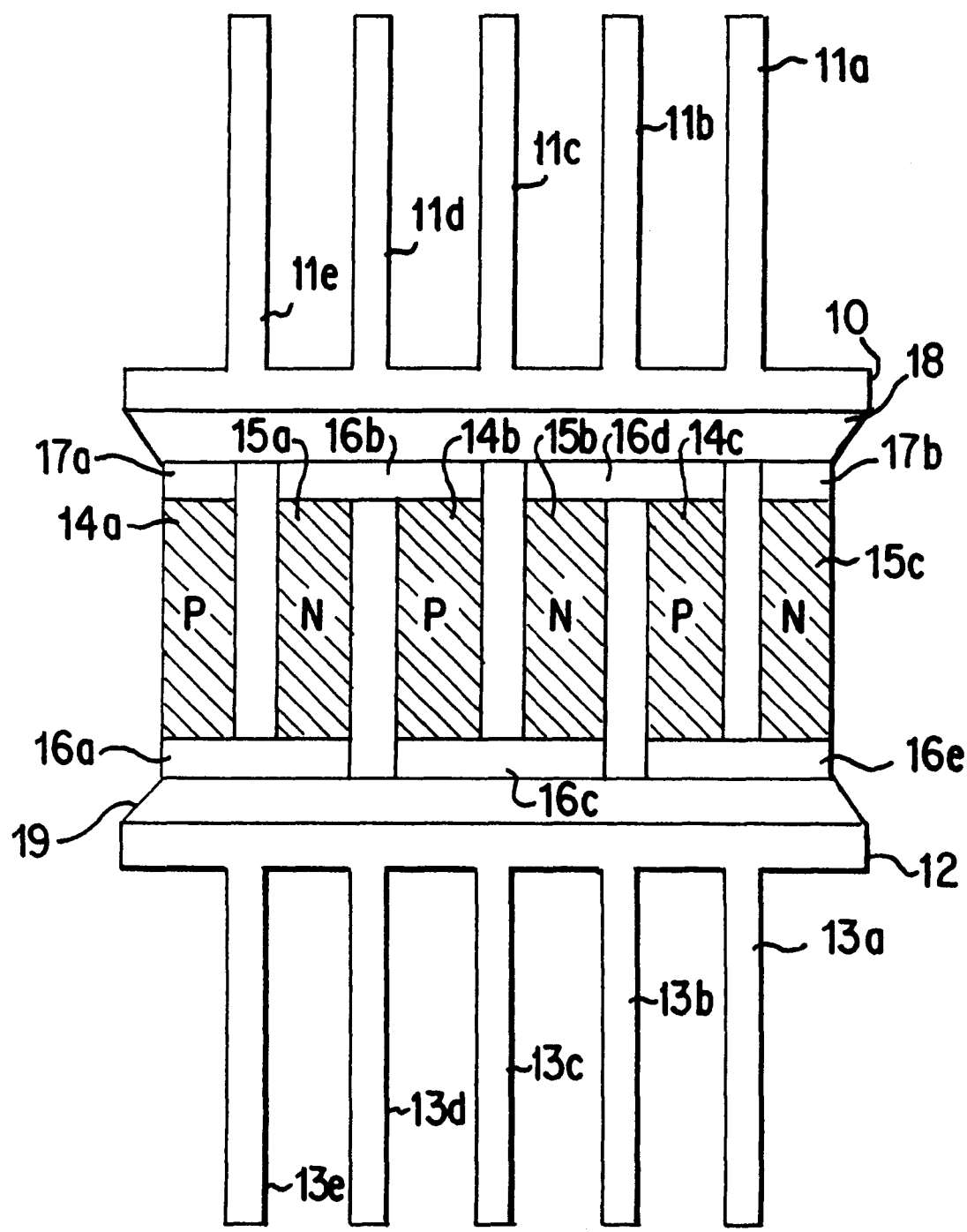
FIG. 2 is a diagram of a refrigeration device.

The subject of the invention is also devices using only the thermoelectric properties of the thin films of quasicrystalline alloy of the present invention, the operation of which relies on the Peltier effect, such a device can be an air-conditioning device, in which the active element consists of a pair of elements in the form of a thin film of quasicrystalline alloy, these elements being mounted in series, one of the elements of the pair having a negative thermoelectric power and the other element a positive thermoelectric power, or preferably of several similar pairs mounted in series. Depending on the direction of the current flowing through the series of elements, either a temperature rise or a temperature drop occurs at the junction between two elements whose thermoelectric power is of opposite sign. Such a device, which is particularly advantageous for cooling small volumes, has many, many advantages compared to conventional refrigeration devices. It does not use polluting fluids such as freons, it does not have a motor and consequently produces no undesirable vibrations, it cannot wear out and it takes up very little room, the cooling power can be very accurately varied by adjusting the electric current, and reversing the direction of the current can convert the cooling system into a heating system. FIG. 2 is a diagram of a refrigeration device. It consists of an upper element 10 comprising thermal conductors ($11_a$, $11_b$, $11_c$, $11_d$, $11_e$), and a lower element 12 lying in the region to be refrigerated and comprising thermal conductors ($13_a$, $13_b$, $13_c$, $13_d$, $13_e$) Six elements, each having a thin film of a quasicrystalline alloy, are mounted in series. The films ($14_a$, $14_b$, $14_c$) have a positive thermoelectric power and the films ($15_a$, $15_b$, $15_c$) have a negative thermoelectric power. The films are connected together by metallic elements ($16_a$, $16_b$, $16_c$, $16_d$, $16_e$) and to an external electrical circuit by the metallic elements $17_a$ and $17_b$. The metallic elements 16 are separated from the upper element 10 and from the lower element 12 respectively by an electrical insulation 18 and an electrical insulation 19 which are good thermal conductors. The composition of the quasicrystalline films and the direction of the current flowing through the device are chosen so as to cause cooling in the metallic elements ($16_a$, $16_c$, $16_e$), which is transmitted to the lower region to be cooled by the thermal conductors 13.

The present invention is described in more detail in the examples below, given by way of illustration. However, the invention is not limited to these examples.

EXAMPLE 1

A film of a quasicrystalline alloy having the atomic composition $Al_{70.5}Pd_{21}Re_{8.5}$ was deposited on an alumina substrate.

The substrate was subjected to a treatment in an ultrasonic bath containing trichloroethylene and acetone, then degassed under a vacuum of $10^{-7}$ mbar in an evaporation chamber.

The deposition of the film of quasicrystalline alloy was carried out by vacuum evaporation of three metal sources consisting respectively of an aluminum ingot, a palladium ingot and a rhenium ingot of very high purity. A film of Pd having a thickness of 578 Å, a layer of Al having a thickness of 2188 Å and then a layer of Re having a thickness of 234 Å were deposited in succession. The device was adjusted so as to obtain a deposition rate of 1 Å/s for Pd, 4 Å/s for Al and 1 Å/s for Re. The deposition rates used represent a compromise between too high a rate, which causes the projection of droplets, and too low a rate, at which excessively high oxidation of the metals occurs.

Next, the coated substrate was placed in a furnace under a dynamic vacuum ($10^{-7}$ mbar) in order to carry out a heat treatment for the purpose of causing interdiffusion of the three elements so as to form a quasicrystalline alloy. The temperature was slowly raised (at 1° C./min) to a temperature of about 700° C., which corresponds to the stability region of the quasicrystalline structure of the present alloy. The coated substrate was held for 3 hours at this temperature and then cooled down to room temperature.

Figure 3:
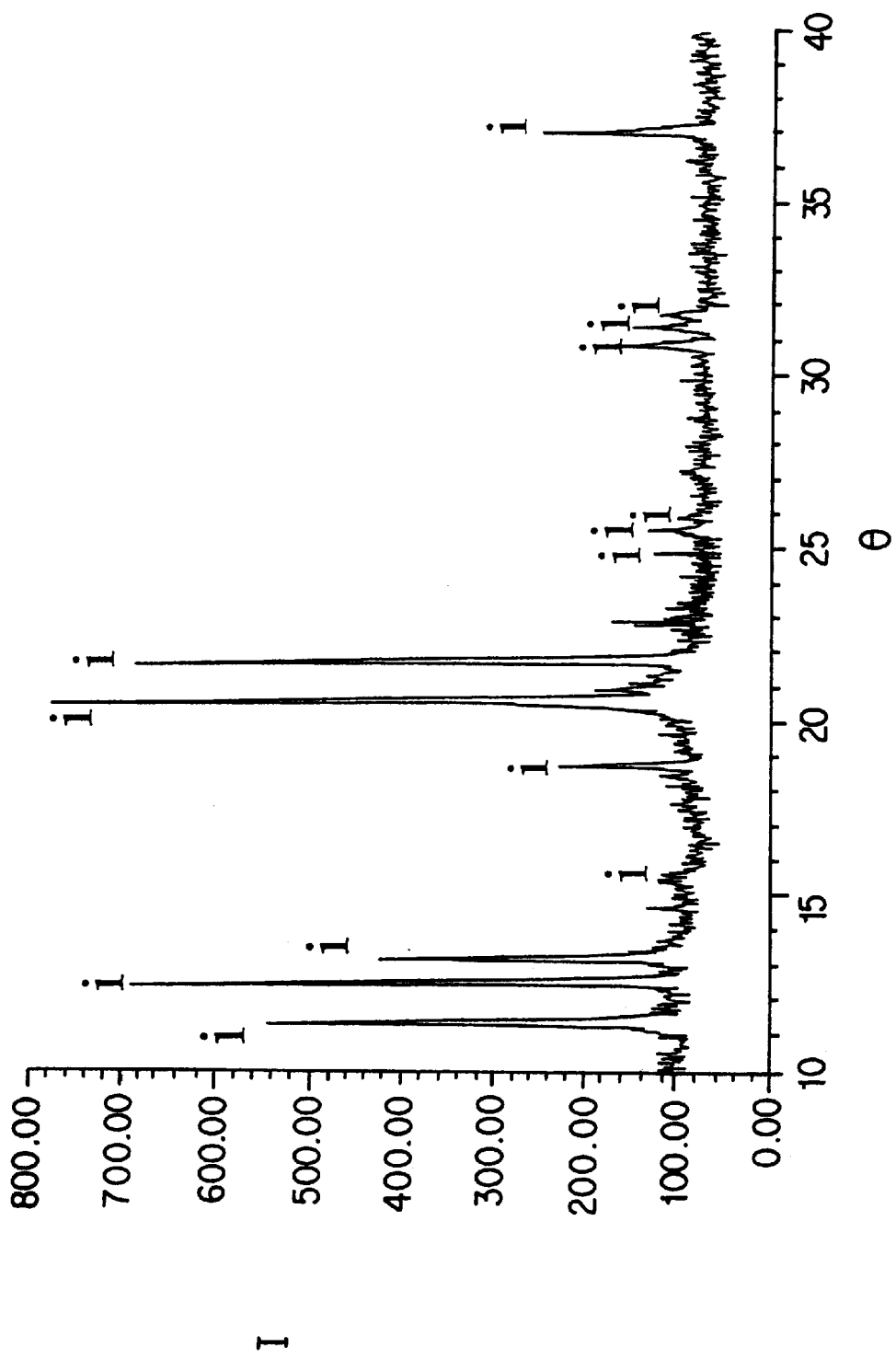
FIG. 3 is an x-ray diffraction diagram of the alloy film of Example 1.

The alloy film was characterized by X-ray diffraction, by electron microscopy and by near-field microscopy. The X-ray diffraction diagram is shown in FIG. 3, in which the number of counts I is plotted as ordinates and the diffraction angle θ is plotted as abscissae. All the lines in the diagram correspond to an icosahedral phase. The electron microscopy images, just like those in near-field microscopy, show grains having a typical size of a few thousand Å, the effects of which, on the roughness, influence the optical properties in the case of radiation having comparable wavelength.

EXAMPLE 2

In the same way as in Example 1, a film of $Al_{73}Re_{17}Si_{10}$ alloy was deposited on an alumina substrate using three sources consisting respectively of an aluminum ingot, a rhenium ingot and a silicon ingot, each of the elements having a very high purity. The elements were deposited in the following order: Si (361 Å), Re (451 Å), Al (2188 Å) in order to obtain a film whose total thickness is 3000 Å. The deposition rates were 1 Å/s for Si, 1 Å/s for Re and 4 Å/s for Al.

A heat treatment was carried out in the same way as in Example 1, the temperature hold being at 600° C. for 2 hours.

Figure 4:
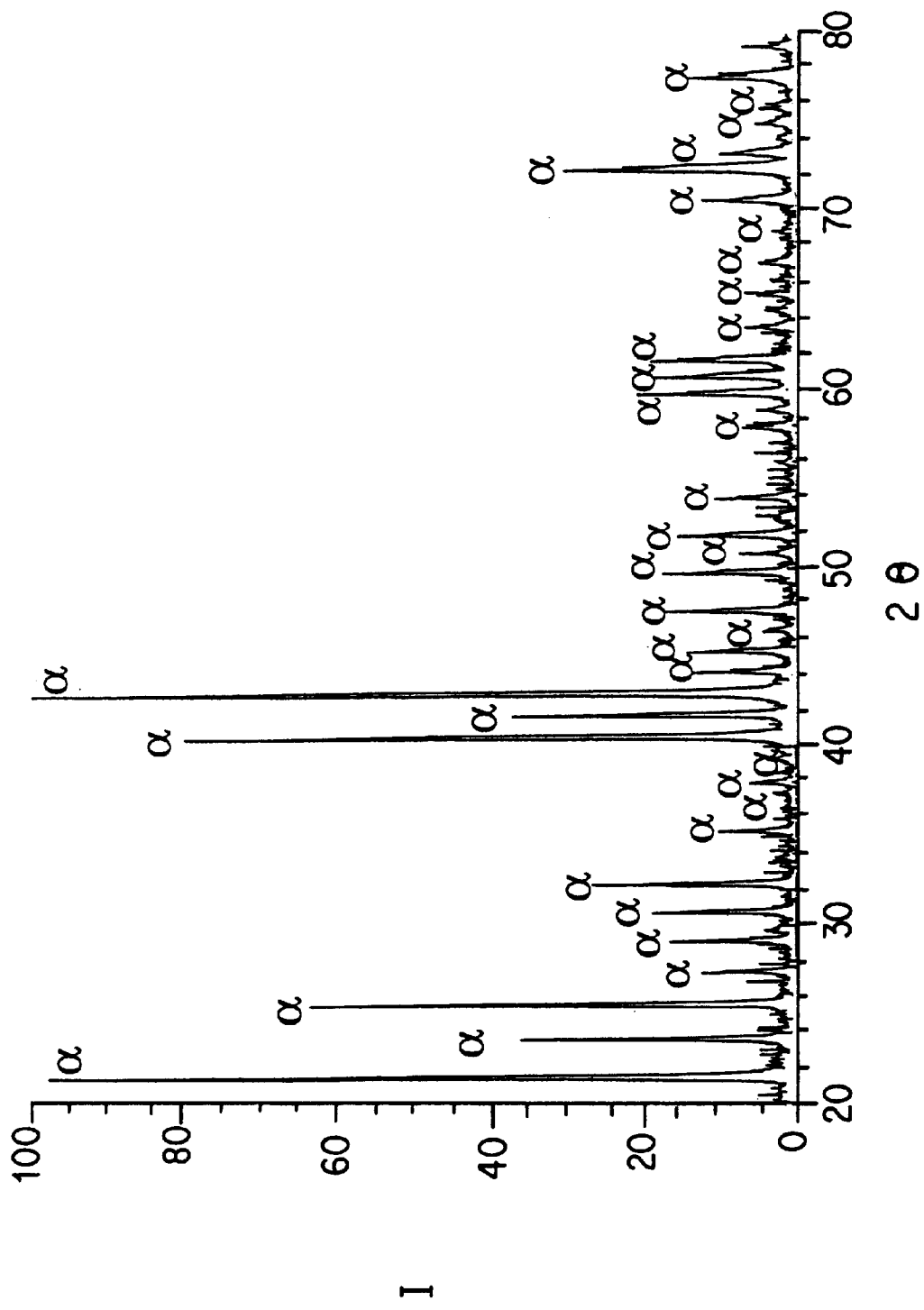
FIG. 4 is an x-ray diffraction diagram of the alloy film of Example 2.

The X-ray diffraction diagram is shown in FIG. 4, in which the normalized intensity I is plotted as ordinates and the diffraction angle 2θ is plotted as abscissae. All the lines present in the diagram correspond to an approximant crystalline phase of a quasicrystal, called a 1/1-order approximant phase.

EXAMPLE 3

In the same way as in Example 1, a film of $Al_{73}Pd_{18.5}Mo_{8.5}$ alloy was deposited on an alumina substrate using three sources consisting respectively of an aluminum ingot, a palladium ingot and a molybdenum ingot, each of the elements having a very high purity. The elements were deposited in the following order: Pd (505 Å), Al (2249 Å), Mo (246 Å). The deposition rates were respectively 0.8 Å/s, 4 Å/s, 1 Å/s.

A heat treatment was carried out in the same way as in Example 1, the temperature hold being at 350° C. for 6 hours.

All the lines present in the X-ray diffraction diagram correspond to a quasicrystalline phase of the icosahedral type.

EXAMPLE 4

In the same way as in Example 1, a film of $Al_{70.5}Pd_{21}Re_{6.5}Mo_2$ alloy was deposited on an alumina substrate using four sources consisting respectively of an aluminum ingot, a palladium ingot, a rhenium ingot and a molybdenum ingot, each of the elements having a very high purity. The elements were deposited in the following order: Pd (576 Å), Al (2189 Å), Mo (58 Å), Re (178 Å). The deposition rates were respectively 0.8 Å/s, 4 Å/s, 0.5 Å/s, 1 Å/s.

A heat treatment was carried out in the same way as in Example 1, the temperature hold being at 750° C. for 3 hours.

Figure 5:
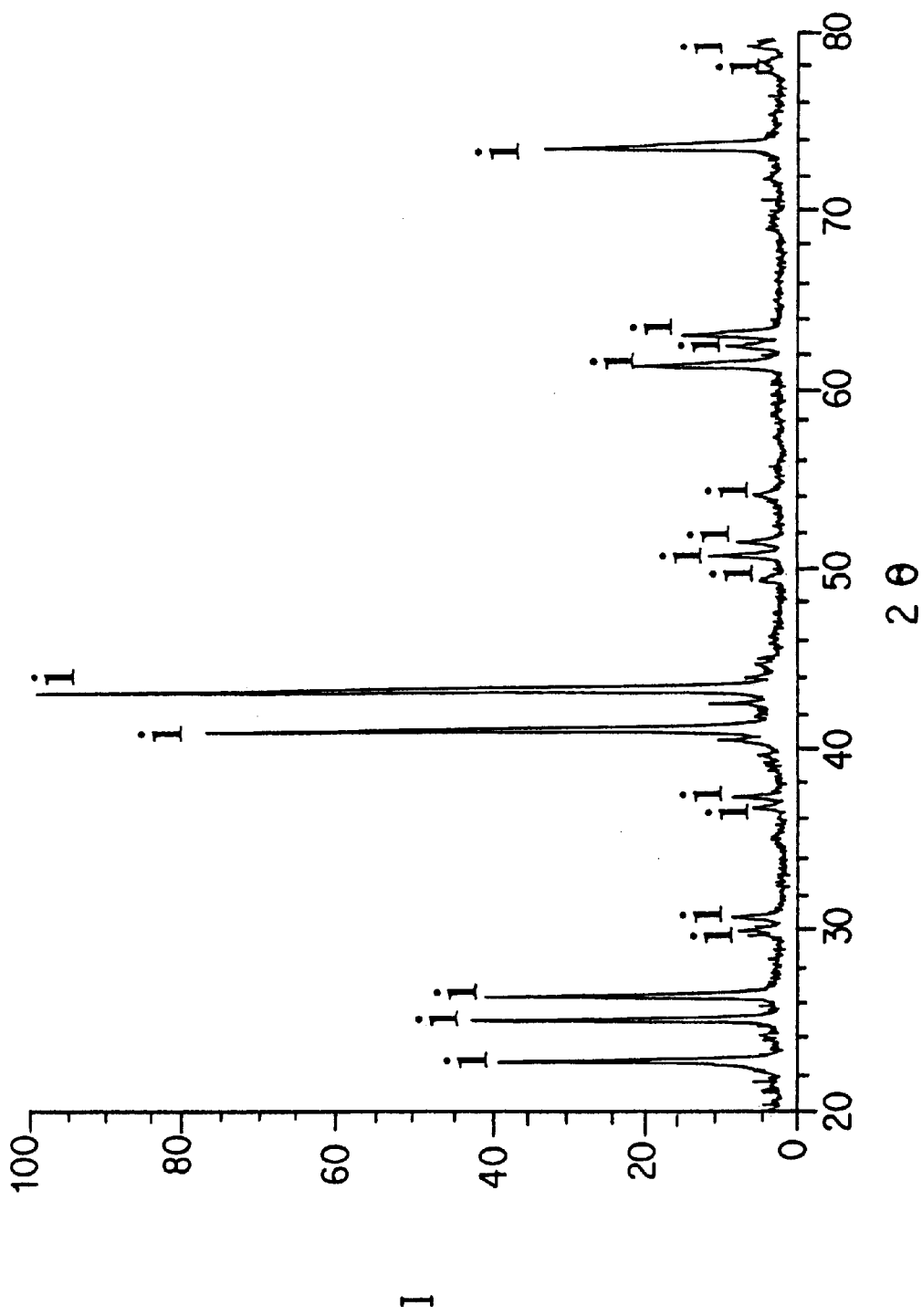
FIG. 5 is an x-ray diffraction diagram of the alloy film of Example 4.

The X-ray diffraction diagram is shown in FIG. 5, in which the normalized intensity I is plotted as ordinates and the diffraction angle 2θ is plotted as abscissae. All the lines present in the diagram correspond to a quasicrystalline phase of the icosahedral type.

EXAMPLE 5

(Comparative)

In the same way as in Example 1, a film of $Al_{62.5}Cu_{25}Fe_{12.5}$ alloy was deposited on an alumina substrate using three sources consisting respectively of an aluminum ingot, a copper ingot and an iron ingot, each of the elements having a very high purity. The elements were deposited in the order: Al (2100 Å), Fe (300 Å), Cu (600 Å). The deposition rates were respectively 4 Å/s, 1 Å/s, 2 Å/s.

A heat treatment was carried out, consisting of a temperature rise up to 350° C., with a temperature hold at this temperature lasting 15 hours, followed by a new temperature rise up to 600° C., with a temperature hold at this temperature lasting 3 hours.

All the lines present in the X-ray diffraction diagram correspond to a quasicrystalline phase of the icosahedral type.

EXAMPLE 6

Various optical properties of the specimen obtained in Example 1, consisting of an alumina substrate coated with a 3000 Å film of quasicrystalline alloy $Al_{70.5}Pd_{21}Re_{8.5}$, were evaluated.

Figure 6:
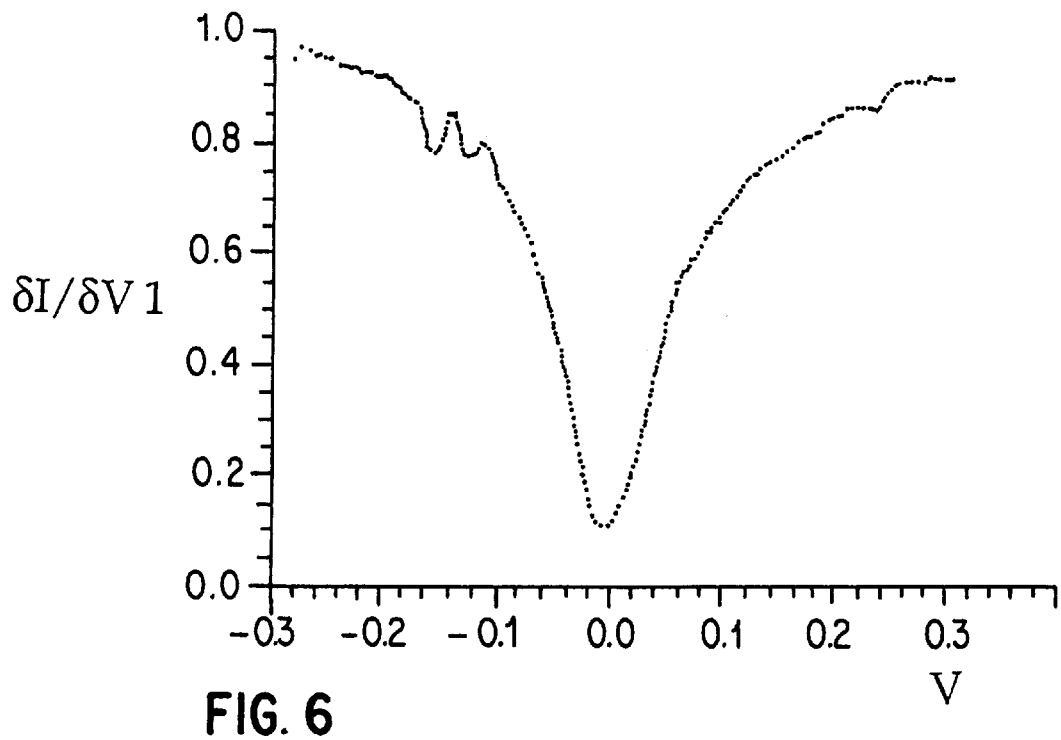
FIG. 6 shows the derivative of curve I(V), $\delta I/\delta V$, expressed in arbitrary units, for the alloy $Al_{70.5}Pd_{21}Re_{8.5}$.

The variation in the intensity of the current emitted between a metal point and an alumina substrate coated with a film of quasicrystalline alloy having a thickness of 3000 Å as a function of the applied voltage was studied in the case of an $Al_{70.5}Pd_{21}Re_{8.5}$ composition. FIG. 6 shows the derivative of curve I(V), i.e. δI/δV, expressed in arbitrary units, as a function of the voltage V, for the alloy $Al_{70.5}Pd_{21}Re_{8.5}$. The curve in FIG. 6 Exhibits an anomaly compared to the conventional behavior of a metal (for which δI/δV is represented by a straight line), which is interpreted by the presence of a pseudo-gap of a few tens of meV. The quasicrystalline film will therefore absorb any radiation corresponding to the energy of this pseudo-gap, which corresponds to the infrared range or higher energy range.

Figure 7:
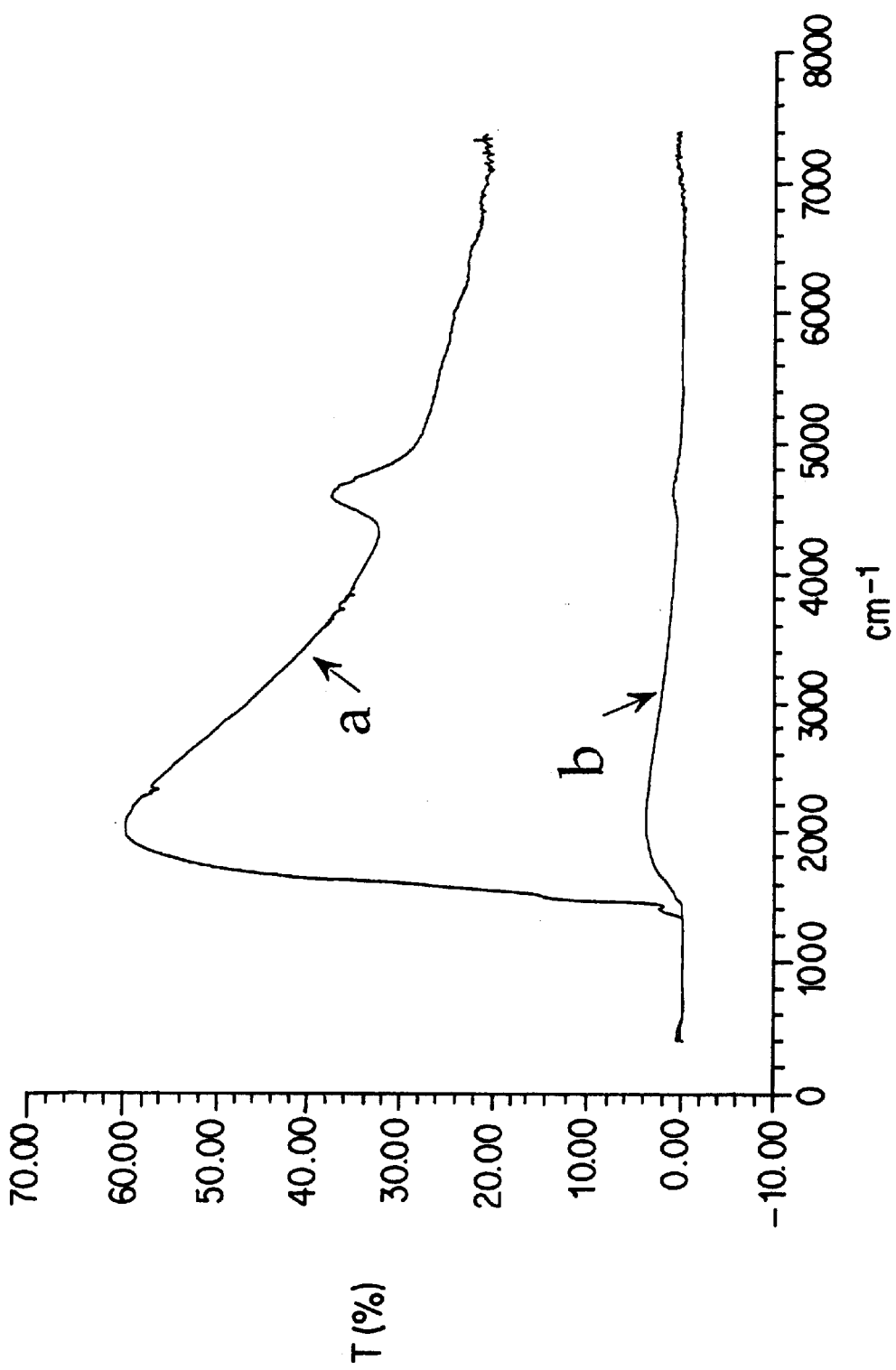
FIG. 7 shows the transmission T expressed as a percentage as a function of energy expressed in $cm^{-1}$ for a substrate alone (curve a) and for a substrate coated with a film of quasicrystalline alloy (curve b)

FIG. 7 shows the transmission T (expressed in %) as a function of the energy (expressed in $cm^{-1}$), between 1400 $cm^{-1}$ (≈0.17 eV) and 7200 $cm^{-1}$ (≈0.9 eV). In FIG. 7, curve a) relates to the substrate alone, curve b) relates to the substrate coated with the film of quasicrystalline alloy.

FIG. 7 shows that the transmission, which is of the order of 8% at 2000 $cm^{-1}$ for the alloy alone, decreases when the energy increases.

Figure 8:
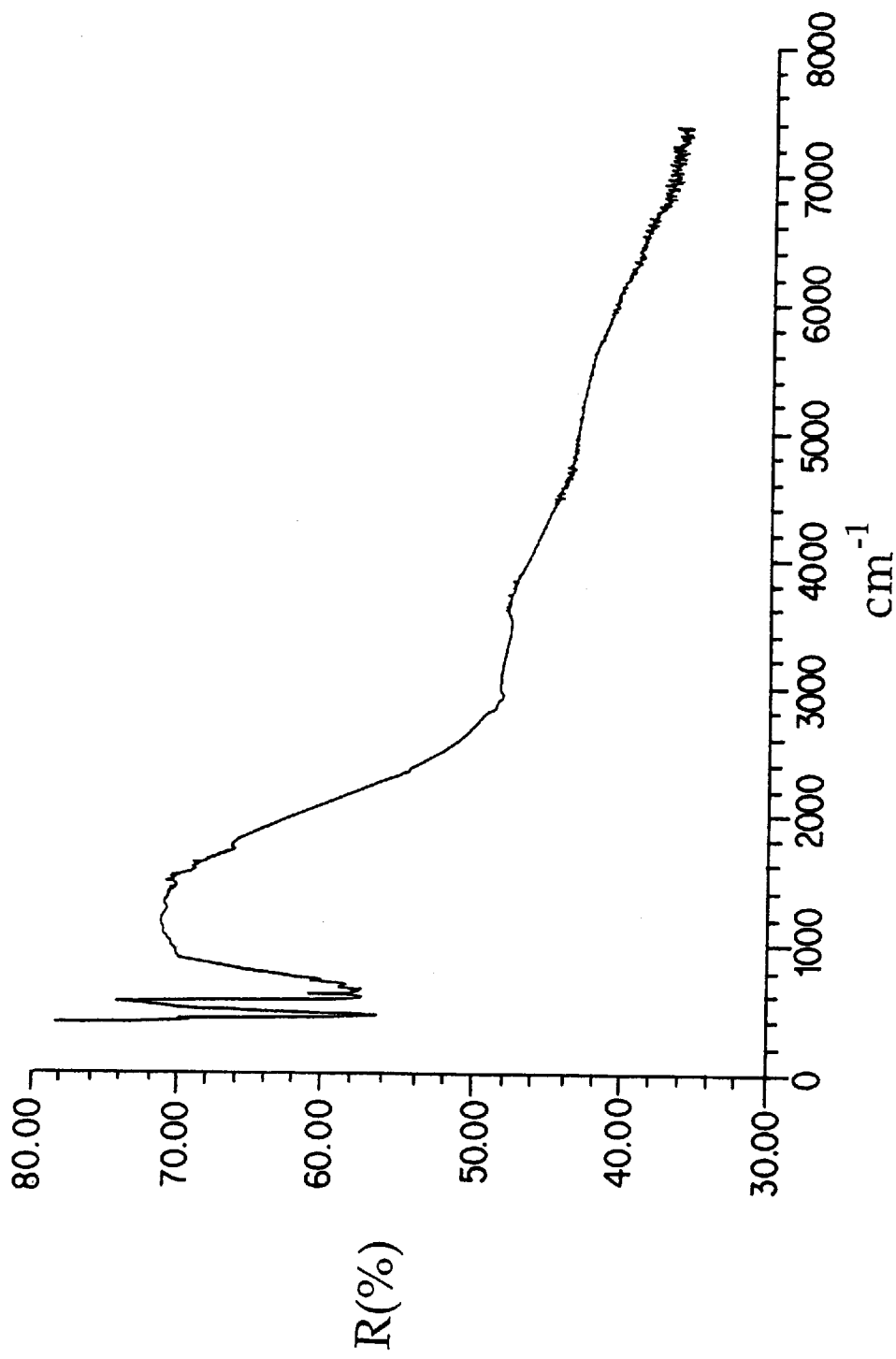
FIG. 8 shows the variation in the reflectivity R as a percentage as a function of the energy expressed in $cm^{-1}$ due to the film of quasicrystalline alloy.

The reflectivity of the substrate alone, and of the substrate coated with a film of quasicrystalline alloy, was measured as a function of the energy. FIG. 8 shows the variation in the reflectivity R, expressed in %, as a function of the energy expressed in $cm^{-1}$. The reflectivity of the substrate alone is negligible for energies greater than 1000 $cm^{-1}$. The variation shown in FIG. 8 is essentially due to the film of quasicrystalline alloy.

Comparing the transmission and reflectivity results shows that the thin film of quasicrystalline alloy exhibits a high degree of absorption of radiation in the infrared range. This confirms the interest in using it as an active element in a system for detecting or for measuring infrared radiation.

EXAMPLE 7

A film of a quasicrystalline alloy $Al_{70.5}Pd_{21}Re_{8.5}$ having a thickness of 3000 Å was used as the resistive layer of a temperature probe and the variation in the electrical resistivity and resistance was measured as a function of the temperature at very low temperatures.

Figure 9:
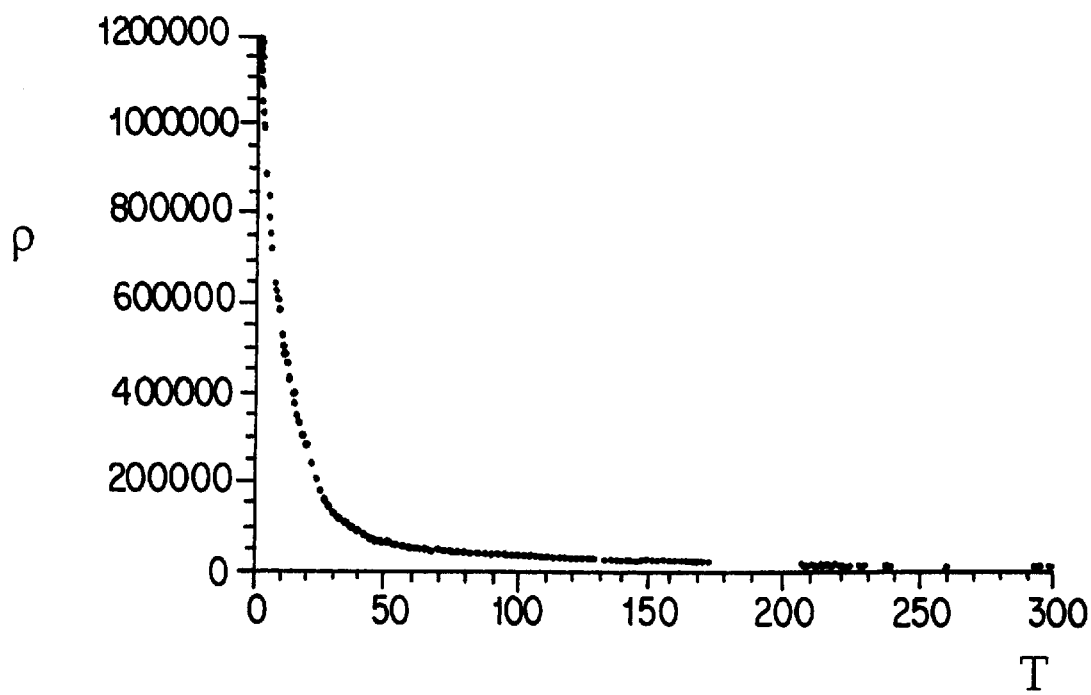
FIG. 9 shows the resistivity p as a function of temperature for the film of quasicrystalline alloy used as the resistive layer of a temperature probe in Example 7.
Figure 10:
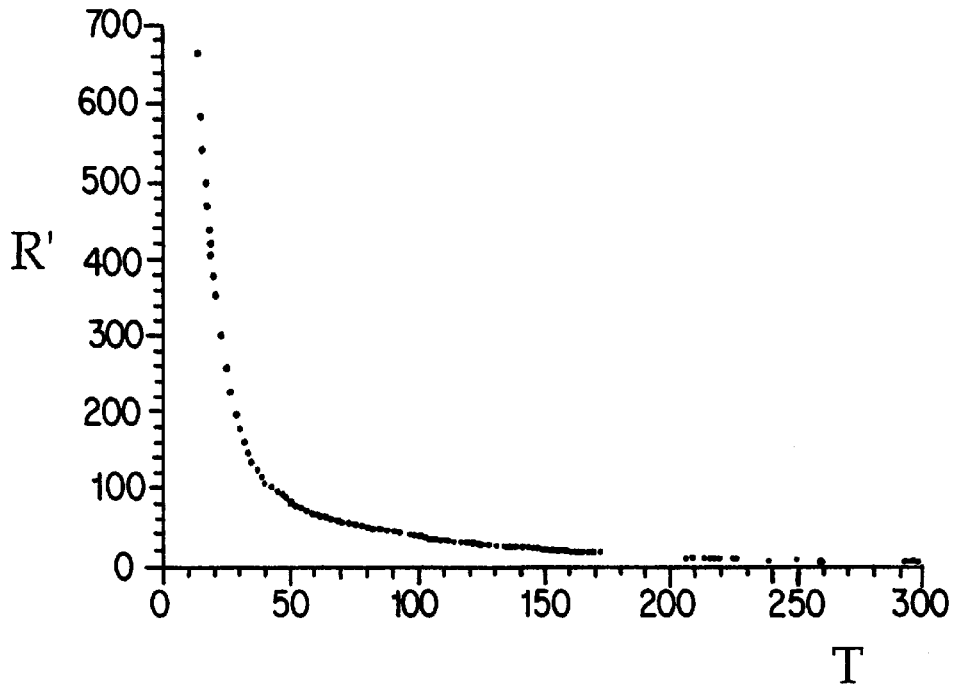
FIG. 10 shows the variation in the resistance as a function of temperature for the film of quasicrystalline alloy used as the resistive layer of the temperature probe in Example 7.

FIG. 9 shows the resistivity ρ, expressed in μΩ cm, as a function of the temperature T, expressed in K. FIG. 10 shows the variation in the resistance R', expressed in Ω, as a function of the temperature T, expressed in K.

The two curves show a rapid drop in the resistance and in the resistivity in the temperature range 0 to 70 K. The temperature coefficient of the resistivity, Δρ/ΔT, is negative: $ρ_{300K}$≈10, 000 μΩ cm and $ρ_{4K}/ρ_{300K}$≧3.

The error introduced by the magnetoresistance in the temperature measurement was determined. The results are given in Table 1 below.

TABLE 1

| Magnetic field (tesla) ⇒ temperature (kelvin) ⇓ | 1 | 2 | 4 | 6 | 8 |
|---|---|---|---|---|---|
| 0.46 | 0.4 | 0.6 | 0.5 | 0.8 | 0.8 |
| 1.6 | 0.2 | 0.6 | 0.6 | 0.5 | 0.5 |
| 4.2 | 0.02 | 0.06 | 0.06 | 0.04 | 0.14 |
| 6 | 0.02 | 0.03 | 0.03 | 0.03 | 0.12 |
| 10 | 0.6 | 0.6 | 0.6 | 0.54 | 0.45 |

Figure 11:
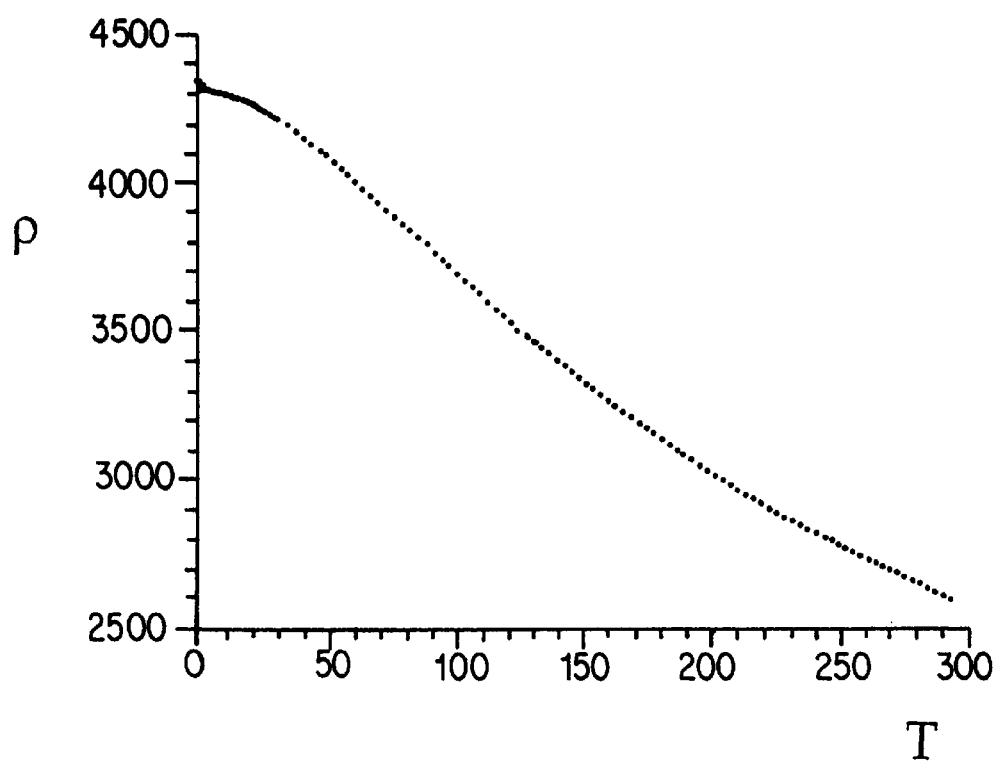
FIG. 11 shows the variation in the resistivity $\rho$ as a function of temperature for the film of quasicrystalline alloy used as the resistive layer of the thermal probe of Example 7.

A thermal probe in which the resistive layer is a film of AlCuFe alloy according to Example 5 was tested under the same conditions. FIG. 11 shows the variation in the resistivity ρ, in μΩ cm, between 0 and 300 K. It shows that the resistivity decreases slowly over this temperature range and that the thin-film AlCuFe alloy of the prior art is not effective as a resistive layer, the more so as the error introduced by the magnetoresistance is markedly greater than that from the quasicrystalline alloy of the present invention.

We claim:

1. Thin film of quasicrystalline alloy having a thickness of between approximately 0.01 and 10 μm comprising one or more quasicrystalline phases having a volume which represents at least 60% by volume of the quasicrystalline alloy, a quasicrystalline phase being either (i) a quasicrystalline phase which exhibits a rotational symmetry selected from the group consisting of symmetries with a 5-, 8-, 10- and 12-fold rotation axis, or (ii) an approxinant phase or an approximant compound which is a true crystal, said approximant phase or compound having a crystallographic structure which exhibits translational symmetry, but which exhibits, in an electron diffraction photograph thereof, diffraction patterns sufficiently close to those of a symmetry of at least one of 5-, 8-, 10- and 12-fold rotation axes such that said diffraction patterns are not distinguishable from those exhibited by a structure having rotational symmetry with said at least one rotation axis;

wherein the alloy has the following nominal composition, which is given in atomic percentages: $Al_aRe_rSi_sX_dMn_m$ in which X represents at least one element selected from the group consisting of B, C, P, S and Ge; $15 \leq r+m \leq 20$, $0 \leq d \leq 5$, $8 \leq s \leq 15$, $a+r+s+d+m=100$.

2. Thin film of quasicrystalline alloy according to claim 1, wherein the quasicrystalline alloy is an AlReSi ternary alloy which has a cubic approximant structure.

3. Thin film of quasicrystalline alloy according to claim 2, wherein the quasicrystalline alloy comprises the composition $Al_{73}Re_{17}Si_{10}$.

4. A device for absorbing infrared radiation comprising an infrared radiation coupling element comprising the thin film of quasicrystalline alloy according to claim 1.

5. A resistive temperature probe comprising a resistive layer comprising the thin film of quasicrystalline alloy according to claim 1.

6. A bolometer comprising an active element comprising the thin film of quasicrystalline alloy according to claim 1.

7. A thermopile comprising an active element comprising the quasicrystalline alloy according to claim 1.

8. An electricity generator comprising an active element comprising the thin film of quasicrystalline alloy according to claim 1.

9. An air-conditioning system whose operation depends on the Peltier effect comprising an active element comprising the thin film of quasicrystalline alloy according to claim 1.

10. A thermocouple comprising an active element comprising the thin film of quasicrystalline alloy according to claim 1.

11. Process for producing a thin film of quasicrystalline alloy comprising the step of depositing the alloy on a substrate by vapor deposition; wherein the alloy has a thickness of between approximately 0.01 and 10 μm comprising one or more quasicrystalline phases having a volume which represents at least 60% by volume of the quasicrystalline alloy, a quasicrystalline phase being either (i) a quasicrystalline phase which exhibits a rotational symmetry selected from the group consisting of symmetries with a 5-, 8-, 10- and 12-fold rotation axis, or (ii) an approximant phase or an approximant compound which is a true crystal, said approximant phase or compound having a crystallographic structure which exhibits translational symmetry, but which exhibits, in an electron diffraction photograph thereof, diffraction patterns sufficiently close to those of a symmetry with at least one of 5-, 8-, 10- and 12-fold rotation axes such that said diffraction patterns are not distinguishable from those exhibited by a structure having rotational symmetry with said at least one rotation axis; and wherein the alloy has the following nominal composition, which is given in atomic percentages: $Al_aRe_rSi_sX_dMn_m$, in which X represents at least one element selected from the group consisting of B, C, P, S and Ge,; $15<r+m<20$, $0<d<5$, $8<s<15$, $a+r+s+d+m=100$.

12. Process according to claim 11 wherein the vapor deposition is carried out by sputtering, by vacuum evaporation or by laser ablation.

13. Process according to claim 11, wherein the vapor deposition is carried out using a source of a single material.

14. Process according to claim 11, wherein the vapor deposition is carried out using several sources.

15. Process according to claim 11, further comprising the step of heat treating said alloy deposited onto a substrate.

16. Process according to claim 15, wherein the step of heat treating further comprises a slow temperature rise, at less than 20° C./min up to a temperature corresponding to a region for forming the quasicrystalline structure of the alloy, and a temperature hold, at this temperature, for a period of from approximately 2 to approximately 4 hours.

17. Process according to claim 16, wherein said step of heat treating further comprises a slow temperature rise of approximately 1° C./min.

18. A film-forming coating composition comprising a quasicrystalline alloy comprising one or more quasicrystalline phases having a volume which represents at least 60% by volume of the quasicrystalline alloy, a quasicrystalline phase being either (i) a quasicrystalline phase which exhibits a rotational symmetry selected from the group consisting of symmetries with a 5-, 8-, 10- and 12-fold rotation axis, or (ii) an approximant phase or an approximant compound which is a true crystal, said approximant phase or compound having a crystallographic structure which exhibits translational symmetry, but which exhibits, in an electron diffraction photograph thereof, diffraction patterns sufficiently close to those of a symmetry with at least one of 5-, 8-, 10- and 12-fold rotation axes such that said diffraction patterns are not distinguishable from those exhibited by a structure having rotational symmetry with said at least one rotation axis;

wherein the alloy has the following nominal composition, which is given in atomic percentages: $Al_aRe_rSi_sX_dMn_m$ in which X represents at least one element selected from the group consisting of B, C, P, S and Ge; $15 \leq r+m \leq 20$, $0 \leq d \leq 5$, $8 \leq s \leq 15$, $a+r+d+m=100$.

* * * * *